United States Patent
Knoop

[11] Patent Number: 5,818,696
[45] Date of Patent: Oct. 6, 1998

[54] MOUNTING PANEL FOR ASSEMBLIES

[75] Inventor: Franz-Josef Knoop, Büren, Germany

[73] Assignee: Siemens Nixdorf Informationssysteme Aktiengesellschaft, Paderborn, Germany

[21] Appl. No.: 714,064

[22] PCT Filed: Mar. 2, 1995

[86] PCT No.: PCT/DE95/00279

§ 371 Date: Sep. 12, 1996

§ 102(e) Date: Sep. 12, 1996

[87] PCT Pub. No.: WO95/25421

PCT Pub. Date: Sep. 21, 1995

[30]    Foreign Application Priority Data

Mar. 14, 1994 [DE]    Germany ............... 44 08 542.7

[51] Int. Cl.⁶ .................................................. H05K 5/00
[52] U.S. Cl. .................... 361/730; 361/725; 361/727; 361/735; 361/732; 361/685; 439/928.1
[58] Field of Search .................... 361/685, 724, 361/725, 727, 730, 732, 735, 796, 801, 802, 784, 785, 799; 439/928.1

[56]                References Cited

U.S. PATENT DOCUMENTS

| | | | |
|---|---|---|---|
| 3,631,325 | 12/1971 | Wenz | 361/705 |
| 4,382,271 | 5/1983 | Villemont et al. | 361/721 |
| 4,821,145 | 4/1989 | Corfits et al. | 361/692 |
| 4,840,570 | 6/1989 | Mann, Jr. et al. | 439/74 |
| 4,967,311 | 10/1990 | Ferchau et al. | 361/736 |
| 5,062,801 | 11/1991 | Roos | 361/803 |

FOREIGN PATENT DOCUMENTS

| | | |
|---|---|---|
| 0 299 199 A2 | 6/1988 | European Pat. Off. . |
| 0 317 464 A2 | 9/1988 | European Pat. Off. . |
| 0 474 181 A1 | 9/1991 | European Pat. Off. . |
| 1 231 772 | 4/1962 | Germany . |
| GM 80 15 311 | 6/1980 | Germany . |
| CH 653 837 A5 | 6/1981 | Germany . |
| 41 04 984 A1 | 2/1991 | Germany . |

*Primary Examiner*—Leo P. Picard
*Assistant Examiner*—Boris L. Chervinsky
*Attorney, Agent, or Firm*—Hill & Simpson

[57]                ABSTRACT

An arrangement for the flexible design of a mounting rack is provided. A mounting panel is provided which accommodates partial-height modules as opposed to full-height modules. The mounting panel is connected to the rear wall of the rack and includes at least one guide rail for supporting the partial-height modules and securing the partial-height modules. A plurality of mounting panels may be disposed next to each other or a mounting panel may be disposed next to a full-height module.

11 Claims, 4 Drawing Sheets

MOUNTING PANEL FOR ASSEMBLIES

FIELD OF THE INVENTION

The present invention is directed toward an apparatus and method for mounting electronic assemblies or electronic modules onto a common rear wall.

DESCRIPTION OF THE PRIOR ART

Rear walls using printed circuit technology are normal for the connection of plug-in assemblies. These rear walls are preferably used for electronic printed circuit board assemblies, a relatively large number of which are plugged in parallel to one another.

In contrast, flat cable connectors are normal for peripheral units such as magnetic disk memories, the units being mounted on their longitudinal sides and contact being made with them, at their rear, via the flat cable connectors.

It is necessary to fit and wire up a large number of small disk drives, in particular with the cost-effective availability of physically small magnetic disk drives using 3½" or 2½" technology, in conjunction with disk bus systems such as SCSI and RAID technology.

The object of the invention is to specify a mounting rack in which modules of various heights can be arranged such that they can be plugged in any desired sequence, which can be determined in advance, without having to adapt the mounting rack itself. At the same time, good sealing with respect to interference radiation is desirable.

SUMMARY OF THE INVENTION

The above object is achieved in that a mounting panel which is similar to a full-height, very narrow module is used for assemblies, which are called modules in the following text, and which are less than full height, but in particular are only half, a third or a quarter of the full height (partial-height modules), which mounting panel uses the guide rails in the mounting rack for full-height modules and, for its part, has on its surface guide rails for the modules to be supported. The modules are arranged one above the other on the mounting panel and are thus generally designed with a front panel of the same width.

It is thus possible to determine in advance, as required the sequence of spaces for partial-height modules and full-height modules. This is of particular importance in the case of high-performance multi-user computers having large bulk storage volumes which are expediently and cost-efficiently constructed from hard-disk drives using 3½" or 2½" format, which are produced in large quantities for personal computers. The mounting rack can, in this case, on the one hand accommodate the central processor and the main memory as full-height printed circuit board assemblies. The controllers for the hard disks are likewise designed as generally full-height, printed circuit board assemblies. Two, three, four, six or eight spaces for hard-disk drives are arranged as partial-height modules immediately along-side said controllers on one or two mounting panels, and are connected to the respective control unit via the rear wall, without cables. It should be noted in this case that the SCSI bus, which is frequently used in this context, allows a maximum of seven disk drives and a plurality of control units are therefore unavoidable for large disk capacities; however these control units should be arranged as close as possible to the drives. The guide rails make it easy to fit the drives subsequently, or, particularly in the case of RAID systems, replaceably while operation is continuing. A further advantage of this arrangement is the compact construction and the absence of the connection via cables, which has been necessary until now and is susceptible to faults, when using magnetic disk drives.

Good interference radiation screening with simple means is likewise achievable, since the metallic mounting panel is used as a screen and, as a result of the compact construction, there are only a few gaps, which can be closed well by slit springs.

If the mounting panel is broadened slightly by a front panel, then it is at the same time used as a ventilation channel, which is expedient if the modules themselves permit hardly any vertical air movement. To this end, the mounting panel is provided with an interrupted bead which, at the same time, is a vertical air channel and allows air exchange through the apertures.

A mounting panel can also he used in order to connect control units which are too small for an entire printed circuit board assembly but are nevertheless intended to be capable of being configured easily, for example for data transmission for local networks and long-distance networks, which require different modules in each case.

The form with vertically arranged modules which is illustrated in the exemplary embodiment is frequently preferred because it is easier to cool the modules by convection. However, a horizontal arrangement which is rotated through 90 degrees does not preclude this, it being possible to use this arrangement when either a very large number of modules have to be accommodated and the physical width has to be kept small at the cost of the physical height, or some of the modules are not approved for vertical operation.

DESCRIPTION OF THE PREFERRED EMBODIMENTS

Figure 1:
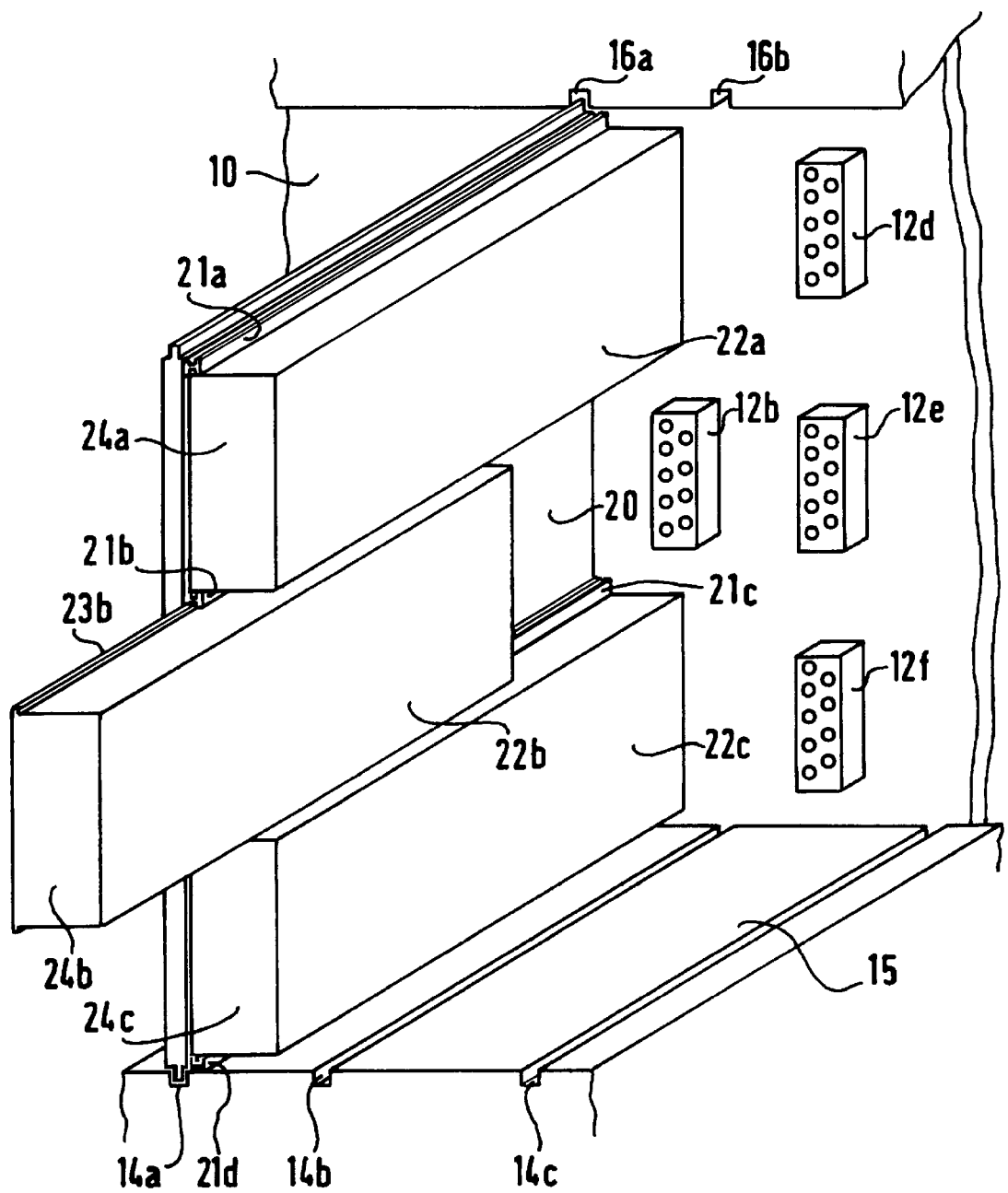
FIG. 1 is a perspective view of a mounting rack made in accordance with the present invention.

A rear wall 10, which is part of a mounting rack, is illustrated in FIG. 1. Plug connectors 12a . . . f are arranged in a rectangular grid, in this case with three per column as an example, on this rear wall. The mounting rack has a space at the top, which is not illustrated, for the modules which are to be accommodated, and a bottom 15. Guide rails, which are illustrated as grooves 14a . . . c, 16a . . . b in this case, are provided in the top and bottom. A full-height module of a known type, which is not illustrated for the sake of clarity, is fitted with three connectors which mate with the plug connectors 12d . . . f, and is pushed into the mounting rack, sliding in the grooves 14b and 16b, until the plug connectors are latched in.

Modules 22a . . . c, whose height is essentially a third of the full height, are illustrated as an example of partial-height modules. They are guided by guide rails 21a . . . d on the mounting panel 20 and likewise latch on the rear wall, but in this case by means of in each case one plug connector. The topmost module 22a and the bottom-most module 22c are shown in the inserted position, so that the plug connectors 12a and 12c cannot be seen. The mounting panel 20, for its part, is held by grooves 14a on the bottom 15 and a corresponding groove in the top. It is mechanically connected to the rear wall 10, for example being screwed to it, and thus additionally contributes to the structural integrity of the rear wall.

The partial-height modules 22a . . . c which are illustrated as an example are constructed on a base plate whose edges slide in the guide rails on the mounting panel. Rectangular boxes are placed onto this plate, whose front is used as a panel. The mating element for the plug connector on the rear wall is fitted to the rear. Magnetic disk drives with an SCSI bus, for example, are installed in the rectangular boxes.

Figure 2:
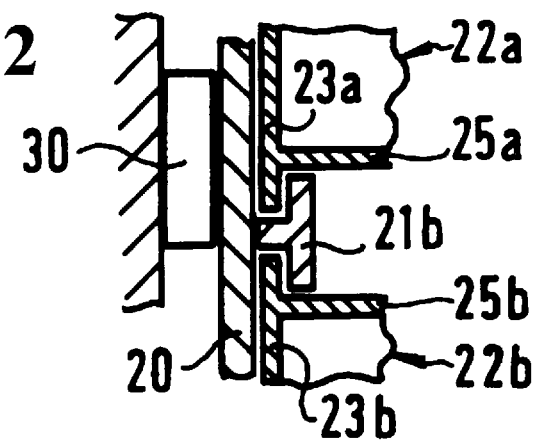
FIG. 2 is an end view of the guide rail disposed on the mounting panel.
Figure 3:
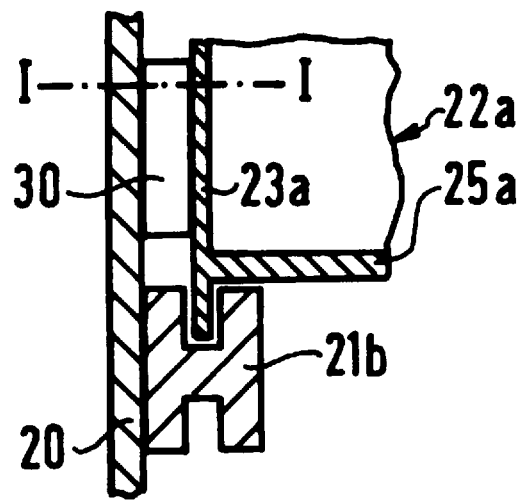
FIG. 3 is an end view of an alternative embodiment for the guide rail disposed on the mounting panel.
Figure 4:
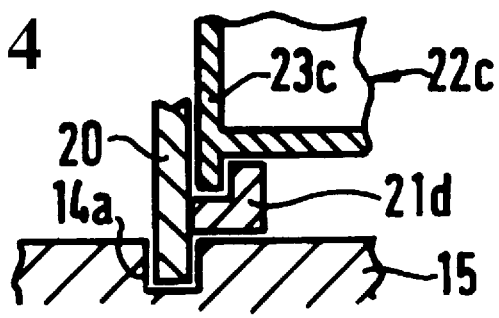
FIG. 4 is an end view of the lower edge of the mounting panel as accommodated in the lower guide member.

One possible configuration of the guide rail 21b on the mounting panel 20 is illustrated in FIG. 2. The guide rail 21b is designed as a T-rail, so that the base plates 23a and 23b of the modules 22a and 22b slide in the groove between the T-rail 21b and the mounting panel 20. The modules 22a and 22b have a bottom 25a and a top 25b. Another possible form with H-shaped rails is shown in FIG. 3. FIG. 4 shows one possible configuration of the guide rail 21d, which corresponds to FIG. 2, at the lower end, with the guide rail 14a in the mounting rack for the mounting panel 20.

Figure 5:
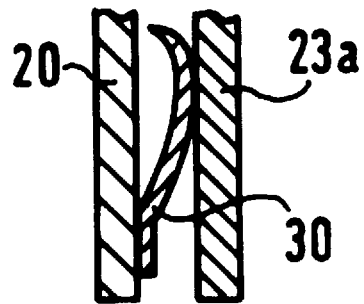
FIG. 5 is an end view illustrating a strip connector between the mounting panel and a module.

The female strip connectors 30 are used for sealing against interference radiation. The sealing of another module with respect to the mounting panel 20 is illustrated in FIG. 2. In this case, the female strip connectors are generally designed to be longer than illustrated, so that they close virtually the entire slit. In the case of the configuration according to FIG. 3, additional female strip connectors 30 are provided which seal the gap between the base plate 23a and the mounting panel 20. FIG. 5 shows a view from above of one possible embodiment of a female strip connector.

Figure 6:
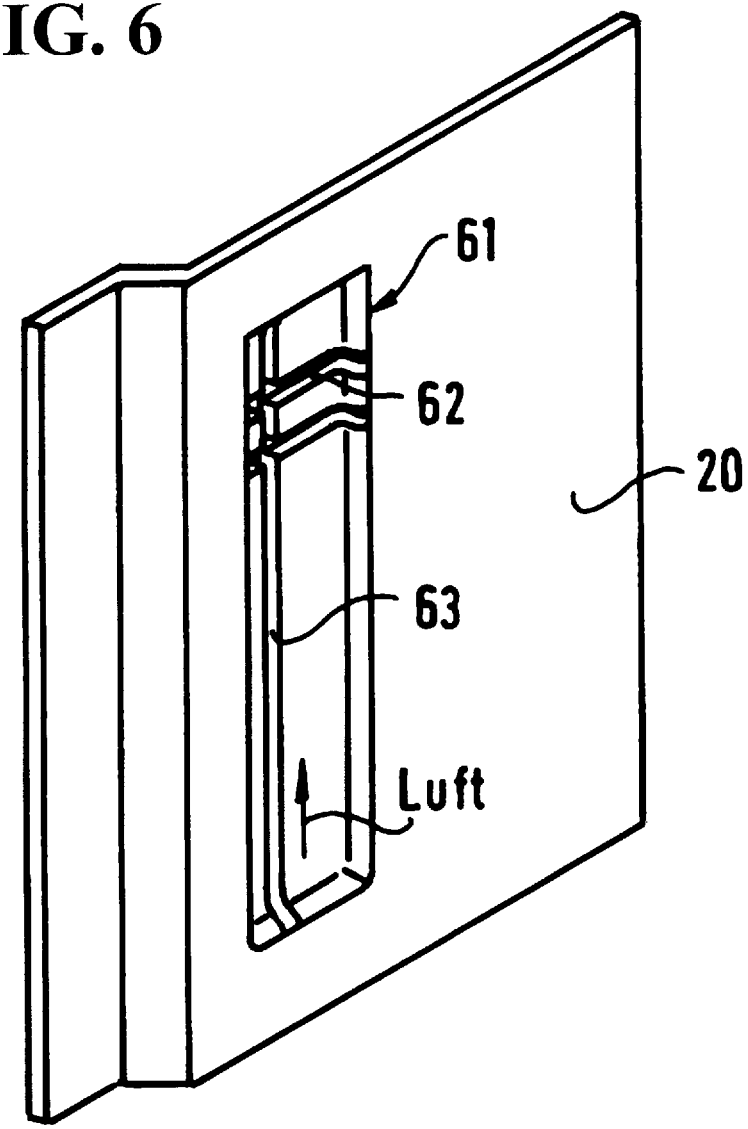
FIG. 6 is a perspective view of an alternative embodiment of the mounting panel of the present invention.

FIG. 6 shows a mounting panel 20 which is broadened by a front panel in comparison with the width predetermined by the plate thickness and the guide rails (which are not shown in FIG. 6). An interrupted bead is produced on the surface of the mounting panel 20. Only one of a plurality of vertical webs 63 and two horizontal webs 62 are shown, for the sake of clarity, these being produced by stamping out rectangular holes. The webs are displaced by deformation, from the surface, in the opposite direction to the side on which the guide rails are arranged. This results in a vertical air channel 61, which is used for cooling the modules which are fitted on the mounting panel.

A pulling and interlocking mechanism, which is not illustrated, of a known type can be used in the modules 22a . . . c, and opposing bearings are provided for this mechanism in the mounting panel 20. As a result of the high level of structural integrity of the mounting panel, said bearings can be designed for strength and rigidity, so that it is possible to provide withdrawing and insertion forces even for plug connectors having a large number of contacts.

The modules can be equipped with panels on the front, the side edges of the panels being enlarged by surfaces which are at right angles to the panels, and these surfaces being electrically connected by contact springs to the respectively adjacent mounting panels and/or modules.

I claim:

1. A mounting rack for mounting a plurality of electronic modules of differing sizes, the mounting rack comprising:
   a rear wall,
   the rear wall comprising a plurality of plug connectors connecting to said modules,
   the rear wall being connected to an upper guide element and a lower guide element, the upper and lower guide elements extending outwardly from the rear wall, the upper and lower guide elements being spaced for accommodating a full-height module,
   a mounting panel connected to and extending perpendicular outward from the rear wall, the mounting panel being held in place by the upper and lower guide elements, the mounting panel including at least one guide rail disposed between the upper and lower guide elements, the guide rail capable of accommodating at least one partial-height module, the at least one partial-height module being directly connected to one of the plug connectors of the rear wall.

2. The mounting rack of claim 1 wherein the guide rail further comprises an upper groove and a lower groove, the upper groove for accommodating an edge of the partial-height module, the lower groove for accommodating an edge of the partial-height module.

3. The mounting rack of claim 1 wherein the guide rail further comprises an upper groove and a lower groove, the partial-height module accommodated between the guide rail and the upper guide element includes a base plate having an edge, the partial-height module accommodated between the guide rail and the lower guide element comprises a base plate having an edge, the upper groove for accommodating the edge of the partial-height module accommodated between the guide rail and the upper guide element, the lower groove for accommodating an edge of the partial-height module accommodated between the guide rail and the lower guide element.

4. The mounting rack of claim 1 wherein each of said partial-height modules comprise an outer panel disposed substantially parallel to the rear wall, each of said outer panels being of a substantially uniform width.

5. The mounting rack of claim 2 wherein each of said partial-height modules comprises a box-shaped housing, an inner side of each box-shaped housing comprises a base plate having at least one edge, the edge of each of said base plates being accommodated in a groove of the guide rail.

6. The mounting rack of claim 1 wherein each of said partial-height modules comprises a box-shaped housing, an inner side of each box-shaped housing comprises a base plate, an outer side of each box-shaped housing being electrically connected to an adjacent module.

7. The mounting rack of claim 1 wherein each of said partial-height modules comprises a box-shaped housing, an inner side of each box-shaped housing comprises a base plate, an outer side of each box-shaped housing being electrically connected to an adjacent mounting panel.

8. The mounting rack of claim 1 wherein the mounting panel is mechanically connected to the rear wall for enhancing the structural integrity of the mounting panel.

9. The mounting rack of claim 1 wherein the mounting panel includes channel, the channel providing air circulation between the mounting panel and the partial-height modules.

10. A method of constructing an assembly of partial-height modules, the method comprising the steps of:
    mounting a plurality of plug connectors to a rear wall, each of said plug connectors for connection to a partial-height module,
    providing an upper guide element and a lower guide element that extend outwardly from the rear wall, the upper and lower guide elements being spaced for accommodating a full-height module, slidably engaging an upper edge of a mounting panel into the upper guide element and a lower edge of the mounting panel into the lower guide element, the mounting panel including at least one guide rail disposed between the upper and lower guide elements, slidably attaching at least one partial-height module between the guide rail and the upper guide element, slidably attaching at least one partial-height module between the guide rail and the lower guide element, connecting each of said partial-height modules directly to one of said connectors.

11. The method of claim 10 further comprising the steps of:

providing additional pairs of upper guide elements and lower guide elements that extend outwardly from the rear wall, the additional pairs of upper and lower guide elements being spaced for accommodating a full-height module, slidably engaging an upper edge of an additional mounting panel into one of the additional upper guide elements and a lower edge of the additional mounting panel into one of the additional lower guide elements, the additional mounting panel including at least one additional guide rail disposed between the additional upper and lower guide elements, slidably attaching an additional partial-height module between the additional guide rail and the upper guide element;

slidably attaching an additional partial-height module between the additional guide rail and the lower guide element;

connecting each of said additional partial-height modules directly to one of said plug connectors at the rear wall.

* * * * *